(12) United States Patent
Matsumura

(10) Patent No.: US 6,626,698 B2
(45) Date of Patent: Sep. 30, 2003

(54) HOLDER FOR A FLAT CIRCUIT MEMBER

(75) Inventor: Kaoru Matsumura, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/189,520

(22) Filed: Jul. 8, 2002

(65) Prior Publication Data

US 2003/0008549 A1 Jan. 9, 2003

(30) Foreign Application Priority Data

Jul. 9, 2001 (JP) ............................. P2001-207948

(51) Int. Cl.[7] .............................................. H01R 12/24
(52) U.S. Cl. ...................................................... 439/496
(58) Field of Search ................................ 439/494–496, 439/498, 499

(56) References Cited

U.S. PATENT DOCUMENTS

| 3,522,652 A | * | 8/1970 | Gordan | 439/496 |
| 4,188,714 A | * | 2/1980 | Jean | 29/827 |
| 4,969,840 A |   | 11/1990 | Ii et al. | |
| 5,954,536 A | * | 9/1999 | Fuerst et al. | 439/493 |
| 6,010,359 A | * | 1/2000 | Etters et al. | 439/496 |
| 6,086,412 A | * | 7/2000 | Watt et al. | 439/496 |
| 6,244,890 B1 | * | 6/2001 | Fuerst et al. | 439/357 |

FOREIGN PATENT DOCUMENTS

| JP | 4-322087 | 11/1992 |
| JP | 11-120780 | 4/1999 |

* cited by examiner

Primary Examiner—Lynn Feild
Assistant Examiner—Hae Moon Hyeon
(74) Attorney, Agent, or Firm—Sughrue Mion, PLLC

(57) ABSTRACT

A holder holds an FPC (flexible printed circuit) wound therearound. The FPC includes conductors, and first and second insulating sheets. The first sheet is removed from an end portion of the FPC to thereby expose the conductors, and a hole is formed through this end portion. The holder includes a plate-like holder body, a pair of projections, and gripping portions. The projections project respectively from opposite surfaces of the holder body. The projection is retained in the hole. The gripping portions grip opposite side edge portions of the FPC. The holder holds the FPC in such a manner that the projection is retained in the hole and that the side edge portions are gripped by the gripping portions, respectively.

14 Claims, 11 Drawing Sheets

HOLDER FOR A FLAT CIRCUIT MEMBER

BACKGROUND OF THE INVENTION

This invention relates to a holder which holds a flat circuit member, and is fitted into a connector housing or the like so as to electrically connect conductors of the flat circuit member to metal terminals.

various electronic equipments are mounted on a vehicle (moving body). Wire harnesses for supplying electric power from a power source to these electronic equipments and for feeding control signals and the like to the electronic equipments are installed on the automobile. The wire harness comprises a plurality of wires, and connectors mounted on ends of the wires.

The wire harness comprises a bundle of wires, and therefore the weight of the wire harness has increased with the increase of the number of wires. Therefore, in recent years, it has been proposed to use a flat circuit member, such as a flexible printed circuit (FPC) an a flexible flat cable (FFC), instead of wires. The flat circuit member comprises conductors, and a pair of insulating sheets covering the conductors and is formed into a flattened shape.

In a wire harness employing the flat circuit member, it has been proposed to use a holder 100 (shown in FIG. 13) and a holder case 101 (shown in FIG. 13) (disclosed, for example, in JP-A-4-322087) in order to connect this flat circuit member to metal terminals of a connector.

The holder 100, shown in FIG. 13, includes a plate-like holder body 102, a plurality of projections 103, and engagement claws 104 for fixing the holder to the holder cave 101. The projections 103 project from one side (or surface) of the holder body 102. The projections 103 are arranged on an edge portion of the holder body 102. The engagement claws 104 are provided at opposite ends of the holder body 102, respectively. The holder case 101 is formed into a frame-like shape. The holder case 101 has engagement reception portions 105 with which the engagement claws 104 are engageable, respectively. A plurality of holes 107 are formed through an end portion of the flat circuit member 106 which is to be held by the holder 100, and the projections 103 can pass through these holes 107, respectively.

The flat circuit member 106 is wound around the holder body 102, and the projections 103 are passed through the holes 107, respectively, and in this manner, the flat circuit member 106 is held by the holder 100. The holder body 102 is passed through the holder case 101, and the engagement claws 104 are engaged with the engagement reception portions 105, respectively. In this manner, the flat circuit member 106, the holder 100 and the holder case 101 are fixed to one another. The holder 100 and the holder case 101, thus combined together, are connected to a connector housing of the connector, thereby electrically connecting conductors 108 of the flat circuit member 106 to the metal terminals, respectively.

One of the pair of insulating sheets is removed from that portion of the flat circuit member 106 (for installation on the automobile or the like) which is to be electrically connected to the metal terminals, so that the conductors 108 are exposed at this portion. The flat circuit member 106 is electrically connected to various electronic equipments, and therefore in some cases, one of the pair of insulating sheets is removed, and in other cases, the other insulating sheet is removed.

In the conventional holder 100 of the above construction, the projections 103 projects from the one surface of the holder body 102. Therefore, in the case where the holder can hold the flat circuit member from which one of the pair of insulating sheets is removed to thereby expose the conductors 108, the holder can not hold the flat circuit member, from which the other insulating sheet is removed, unless the conductors 100 are held between the one insulating sheet and the holder body 102. Therefore, in the case where the conventional holder 100 can electrically connect the conductors 108 of the flat circuit member 106, from which one insulating sheet is removed, to respective conductors such as metal terminals, this holder can not electrically connect the conductors 108 of the flat circuit member 106, from which the other insulating sheet is removed, to the respective metal terminals.

SUMMARY OF THE INVENTION

It is therefore an object of this invention to provide a holder which can positively electrically connect conductors of a flat circuit member, from which either of a pair of insulating sheets is removed, to other conductors such as metal terminals.

(1) A holder comprising:
  a flat circuit member including a plurality of conductors and a pair of insulating sheets covering the plurality of conductors, wherein one of the pair of insulating sheets is removed from an end portion of the flat circuit member so that the plurality of conductors are exposed at the end portion;
  a hole formed through the end portion;
  a holder body, around which the flat circuit member can be wound, defining first and second surfaces; and
  a pair of projections projecting from the first and second surfaces of the holder body, respectively,
  wherein the end portion of the flat circuit body is wound around the holder body, and one of the pair of projections is retained in the hole so as to hold the flat circuit member.

(2) The holder according to (1), wherein a pair of gripping portions for respectively gripping opposite side end portions of the flat circuit member are formed on each of the first and second surfaces of the holder body, respectively.

(3) The holder according to (1), wherein
  the holder body has a plate-like shape, and has opposite surfaces defining the first and second surfaces, respectively, and
  the end portion of the flat circuit member is laid on the first surface, and the projection projecting from the first surface is retained in the hole, and the end portion is folded to be laid on the second surface so that the end portion is wound around the holder body; and (4) The holder according to (3), wherein a tapering surface is formed at an end portion of the projection close to a folded portion of the flat circuit member wound around the holder body.

(5) The holder according to (4), wherein the tapering surface is inclined in a direction perpendicular to the first and second surfaces, and is slanting in a direction away from the folded portion as the distance of the tapering surface from the holder body increases.

(6) The holder according to (2), wherein the gripping portion includes a projected port on projecting from each of the first and second surfaces, and a gripping wall which extends from the projected portion in adirection away from the holder body and extends parallel to the projected portion in overlying relation to the projected portion, so that the side end portions of the flat circuit member can be held between the projected portion and the gripping wall.

(7) The holder according to (6), wherein an end surface of the projection spaced from the holder body and a surface of the projected portions spaced from the holder body are in a same plane.

(8) The holder according to (1), wherein the holder body includes a retaining portion and a retaining reception portion which is engageable with the corresponding retaining portion, and a plurality of the holder bodies are stacked together in such a manner that the retaining portion and the retaining reception portion of each of the plurality of the holder bodies are engaged with the retaining reception portion and the retaining portion of the adjacent holder body, respectively.

In the holder of the invention, the projections project respectively from the one surface and the other surface of the holder body. The flat circuit member can be mounted on the holder body, with one of the projections passed through the hole. Thus, either of the projections is passed through the hole, thereby holding the flat circuit member. Therefore, in the case where either of the first and second insulating sheets is removed to thereby expose the conductors, the flat circuit member can be held by the holder, with the conductors exposed to the outside.

In the holder of the invention, there are provided the gripping portions for respectively gripping the opposite side edge portions of the flat circuit member. Therefore, the flat circuit member, attached to the holder body, with the projection passing through the hole, is prevented from being disengaged from the holder body.

In the holder of the invention, as the distance of the tapering surface from the holder body increases, the tapering surface in slanting gradually in the direction away from the folded portion. Therefore a fold or the like is prevented from being formed at the flat circuit member, attached to the holder, by contact of the projection with the flat circuit member.

In the holder or the invention, the end surface of the projection and the second end surfaces of the projected portions are even with each other. Therefore, the flat circuit member, attached to the holder, is prevented from being curved in the direction of the width thereof. Therefore, a fold or the like is prevented from being formed at the flat circuit member by contact of the projection with the flat circuit member. And besides, the flat circuit member, attached to the holder, is prevented from being curved in the direction of the width thereof, and therefore the opposite side edge portions of the flat circuit member are prevented from being disengaged respectively from the gripping portions. Therefore, the flat circuit member is prevented from being disengaged from the holder body. That the end surface and the second end surfaces are even with each other means that the height of the end surface from the surface of the holder body is equal to (or generally equal to) the height of the second end surfaces from this surface. That the end surface and the second end surfaces are even with each other also means that these end surfaces are disposed on a common plane (or generally common plane).

In the holder of the invention, the plurality of holders can be stacked together in such a manner that each retaining portion is retainingly engaged with the corresponding retaining reception portion. Therefore, the flat circuit members are attached to the holders, respectively, and thereafter the plurality of holders are combined together, and then can be mounted at a time in a connector housing or the like.

DETAILED DESCRIPTION OF PREFERRED EMBODIMENTS

Figure 1:
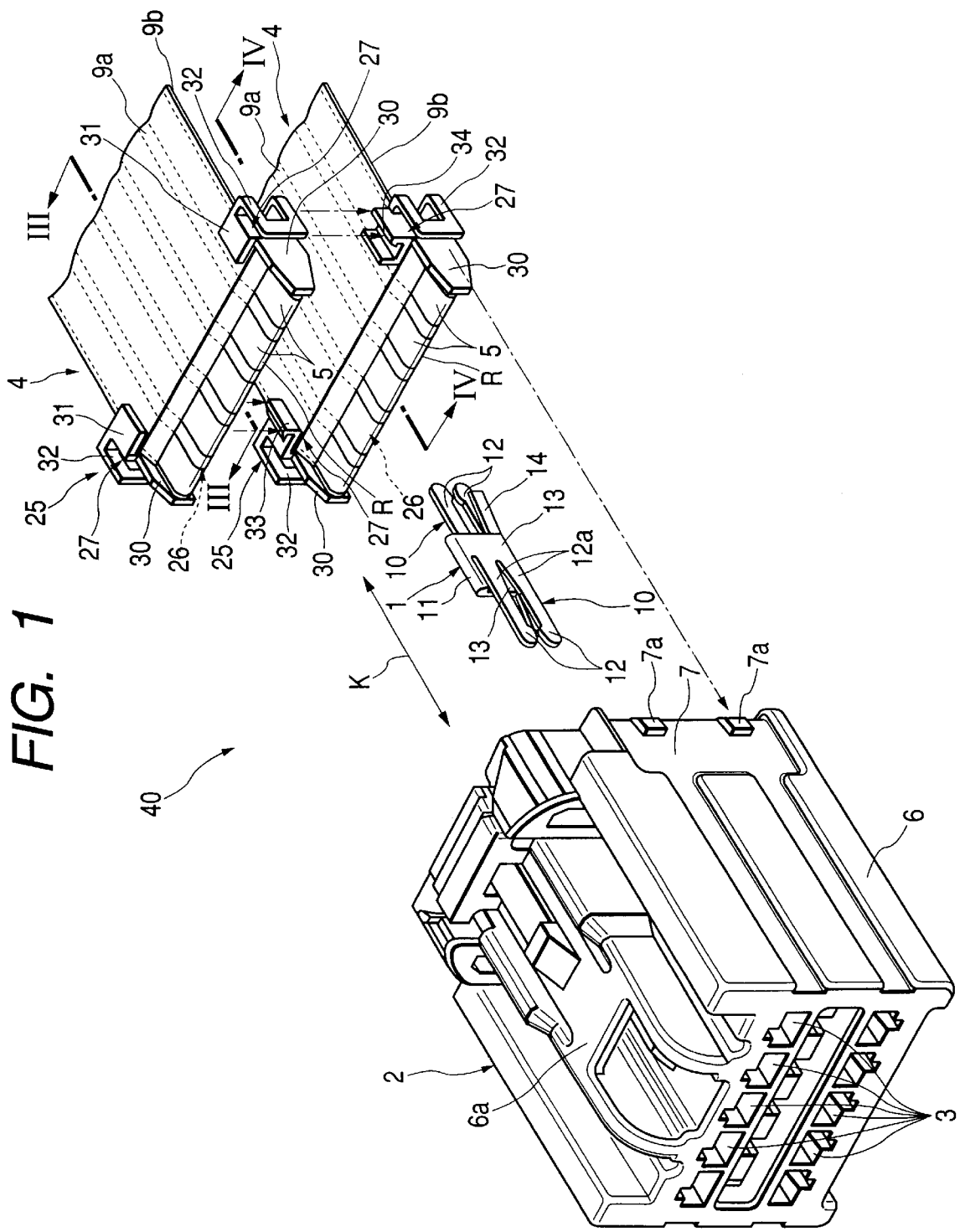
FIG. 1 is an exploded, perspective view of a connector having one preferred embodiment of a holder of the invention.

One preferred embodiment of a holder 25 of the present invention will now be described with reference to FIGS. 1 to 12. The holders 25 of this embodiment constitute a connector 40 shown in FIG. 1. As shown in FIG. 1, the connector 40 comprises a male-type connector housing (hereinafter referred to as "male housing") 2, tuning fork-shape terminals 1 serving as metal terminals, and the pair of holders 25.

The male housing 2 is made of an insulative synthetic resin. As shown in FIG. 1, the male housing 2 includes a body portion 6 for receiving the plurality of tuning fork-shaped terminals 1, and a tubular portion 7 extending from this body portion 6. A plurality of terminal receiving chambers 3 for respectively receiving the tuning fork-shaped terminals 1 are formed within the body portion 6. Each of the terminal receiving chambers 3 is a space formed within the body portion 6, and extends in one direction (indicated by arrow K in FIG. 1).

The tubular portion 7 has a tubular shape, and extends from the body portion 6. The holders 25 (shown in FIG. 1) can be inserted into the tubular portion 7, and an end portion of a flexible printed circuit (hereinafter referred to as "FPC"), serving as a flat circuit member, can be wound around each holder 25. Outwardly-projecting convex portions 7a (shown in FIG. 1) are formed on the tubular portion 7. Lock piece portions 32 (described later) of the holders 25 can be engaged with the convex portions 7a, respectively. The male housing 2 has a lock arm 6a by which the male housing 2 can be held in connected relation to a female connector housing (not shown).

Each tuning fork-shaped terminal 1 is received in the terminal receiving chamber 3, and electrically connects a plate-like electrical contact portion of a male metal terminal (hereinafter referred to as "male terminal") to a corresponding conductor 5 (described later) of the FPC 4 shown in FIG. 1.

Figure 2:
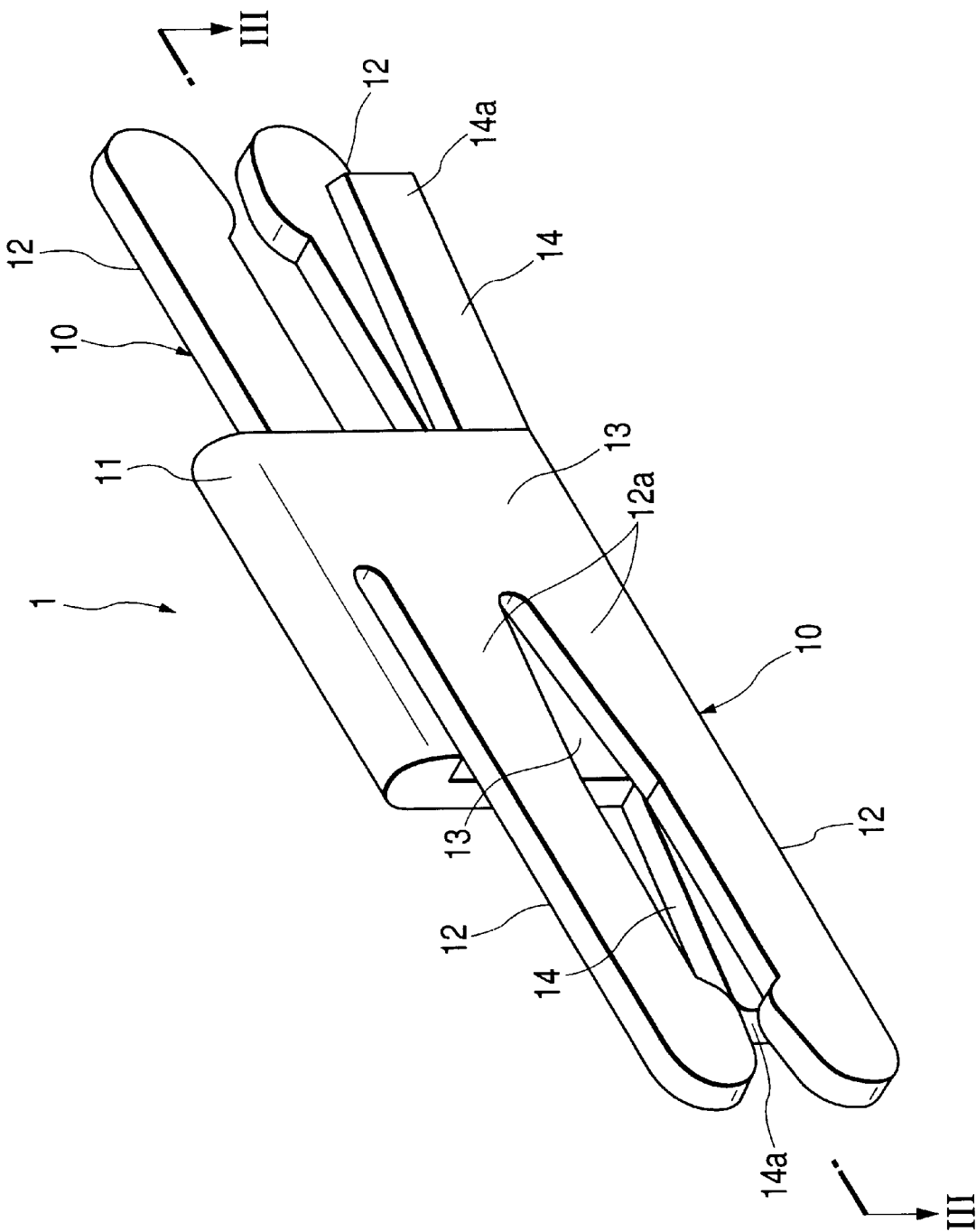
FIG. 2 is a perspective view of a tuning fork-shaped terminal of the connector of FIG. 1.

As shown in FIGS. 1 and 2, the tuning fork-shaped terminal 1 includes a pair of electrical contact portions 10, and an interconnecting portion 11. Each of the electrical contact portions 10 includes a pair of parallel gripping piece portions 12, and a support portion 13 interconnecting one ends of the pair of gripping piece portions 12. The pair of gripping piece portions 12 extend outwardly from the support portion 13. The pair of gripping piece portions 12 of each electrical contact portion 10 extend from the support portion 13 in the same direction in parallel relation to each other.

As shown in FIGS. 1 and 2, the support portion 13 of one electrical contact portion 10, disposed at the front side in FIG. 1, is disposed in overlapping relation to the other electrical contact portion 10 disposed at the rear side in FIG. 1. Thus, the pair of electrical contact portions 10 are disposed in overlapping relation to each other. The pair of electrical contact portions 10 are arranged such that their gripping piece portions 12 extend from their respective support portions 13 in opposite directions. And besides, the pair of electrical contact portions 10 are arranged such that their gripping piece portions 12 are disposed parallel to each other.

As shown in FIGS. 1 and 2, a retaining piece portion 14 for retaining engagement with an inner surface of the terminal receiving chamber 3 in the male housing 2 extends from each of the electrical contact portions 10. The retaining piece portion 14 extends from the support portion 13 in a direction opposite to the direction of extending of the pair of gripping piece portions 12. The retaining piece portion 14 is slightly bent or curved outwardly relative to the support portion 13, that is, in a direction of overlapping of the pair of electrical contact portions 10. When the tuning fork-shaped terminal 1 is received in the terminal receiving chamber 3, the retaining piece portions 14 are retainingly engaged with the inner surface of the terminal receiving chamber 3, thereby preventing the tuning fork-shaped 1 from withdrawal from the terminal receiving chamber 3.

The retaining piece portion 14, extending from the other electrical contact portion 10 disposed at the rear aide in FIG. 2, has an end portion 14a remote from the support portion 13, and this end portion 14a is curved toward the one electrical contact portion 10 disposed at the front side in FIG. 2. A curved surface is formed at this end portion 14a. The distance of this curved surface from the one electrical contact portion 10 is decreasing gradually toward the distal end of the retaining piece portion 14. The curved surface facilitates the insertion of the tuning fork-shaped 1 into the terminal receiving chamber 3. In FIG. 2, an end portion 14a of the retaining piece portion 14, extending from the one electrical contact portion 10 disposed at the front side in FIG. 2, is not bent or curved, and the above curved surface is not formed at this end portion 14a.

The interconnecting portion 13 is formed into a strip-like shape. One end of the interconnecting portion 11 is connected to the support portion 13 of the one electrical contact portion 10, while the other end thereof is connected to the support portion 13 of the other electrical contact portion 10. Thus, the interconnecting portion 11 interconnects the support portions 13 of the pair of electrical contact portions 10.

The tuning fork-shaped terminal 1 of the above construction is inserted into the terminal receiving chamber 3 in the direction of extending of this terminal receiving chamber 3.

As a result, the retaining piece portions 14 are retainingly engaged with the inner surface of the terminal receiving chamber 3. In this manner, the tuning fork-shaped terminal 1 is mounted in the male housing 2. In this condition, the FPC 4 (described later), wound around the holder 25, is press-fitted into the gap between the pair of gripping piece portions 12, and the electrical contact portion of the male terminal (not shown) is press-fitted into the gap between the other pair of gripping piece portions 12. As a result, the pair of gripping piece portions 12 are resiliently deformed away from each other, and the FPC 4 (or the electrical contact portion of the male terminal) is held between the pair of gripping piece portions 12. In this manner, the tuning fork-shaped terminal 1 is electrically connected to the conductor 5 of the FPC 4, and the tuning fork-shaped terminal 1 is electrically connected to the male terminal.

Figure 3:
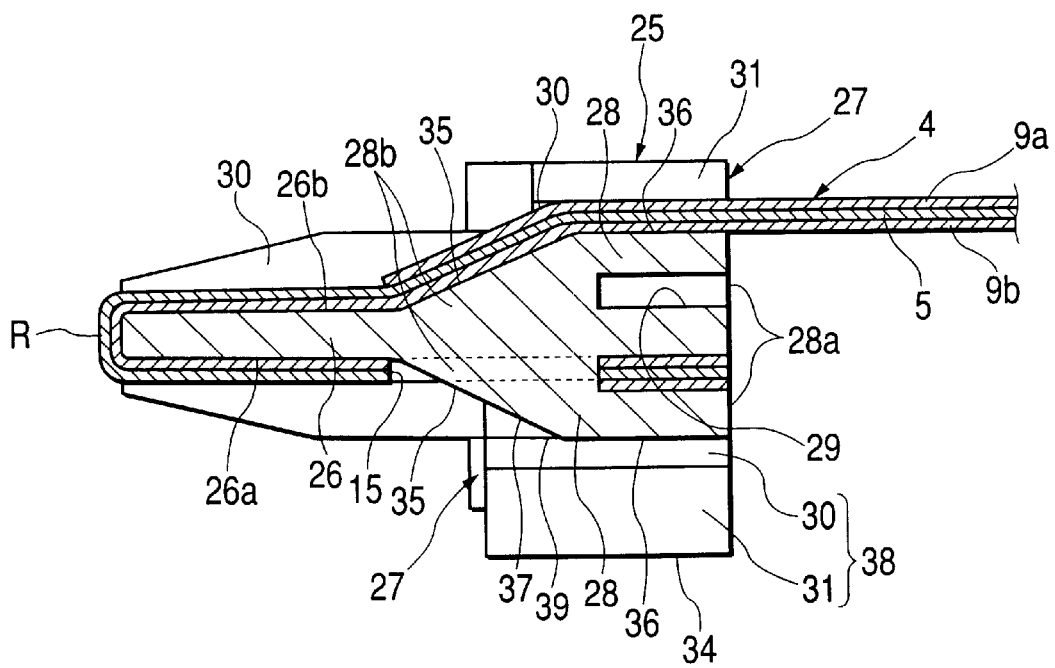
FIG. 3 is a cross-sectional view taken along the line III—III of FIG. 1.
Figure 4:
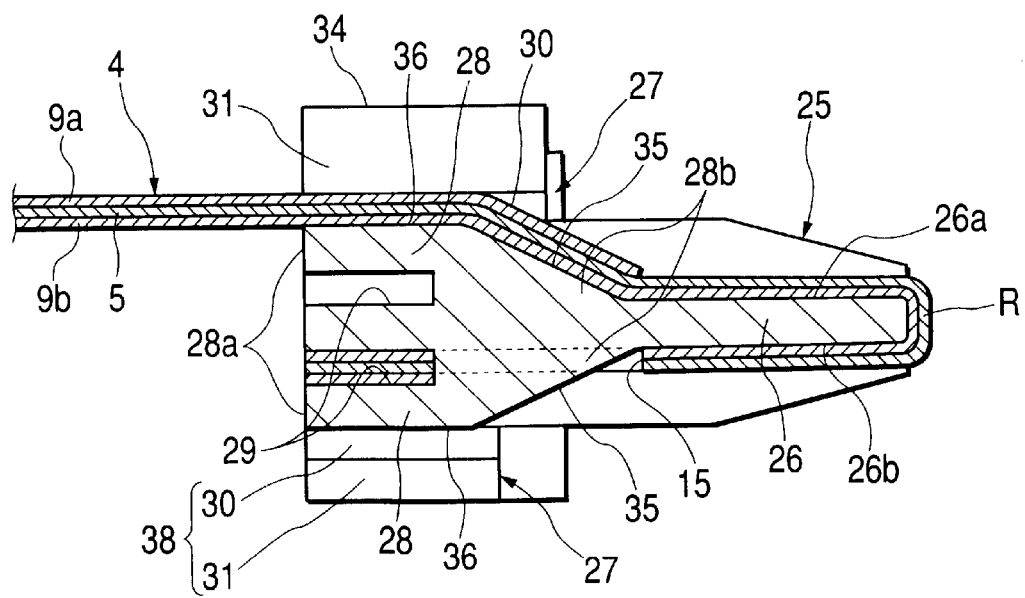
FIG. 4 is a cross-sectional view taken along the line VI—VI of FIG. 1.

As shown in FIGS. 1, 3 and 4, the FPC 4, serving as the flat circuit member, comprises the plurality of conductors 5, and a pair of first and second insulating sheets 9a and 9b covering these conductors 5. Each of the conductors 5 has a rectangular transverse cross-section. Each of the conductors 5 has a strip-like shape. The conductors 5 are arranged in parallel (juxtaposed) relation to one another. The first insulating sheet 9a is made of an insulative synthetic resin, and has a strip-like shape. The first insulating sheet 9a is mounted on one sides (surfaces) of the conductors. The second insulating sheet 9a is made of an insulative synthetic resin, and has a strip-like shape. The second insulating sheet 9b is mounted on the other sides (surfaces) of the conductors 5.

The first and second insulating sheets 9a and 9b cover the plurality of conductors 5 in such a manner that these conductors 5 are held between the first and second insulating sheets 9a and 9b. (The first and second insulating sheets 9a and 9b correspond to insulating sheets recited in the appended claims of this specification.) One of the first and second insulating sheets 9a and 9b is removed from the end portion of the FPC 4, so that the conductors 5 are exposed at this end portion. In the example shown in FIGS. 3 and 4, the first insulating sheet 9a is removed. In an example shown in FIGS. 9 and 10, the second insulating sheet 9b is removed.

Figure 12:
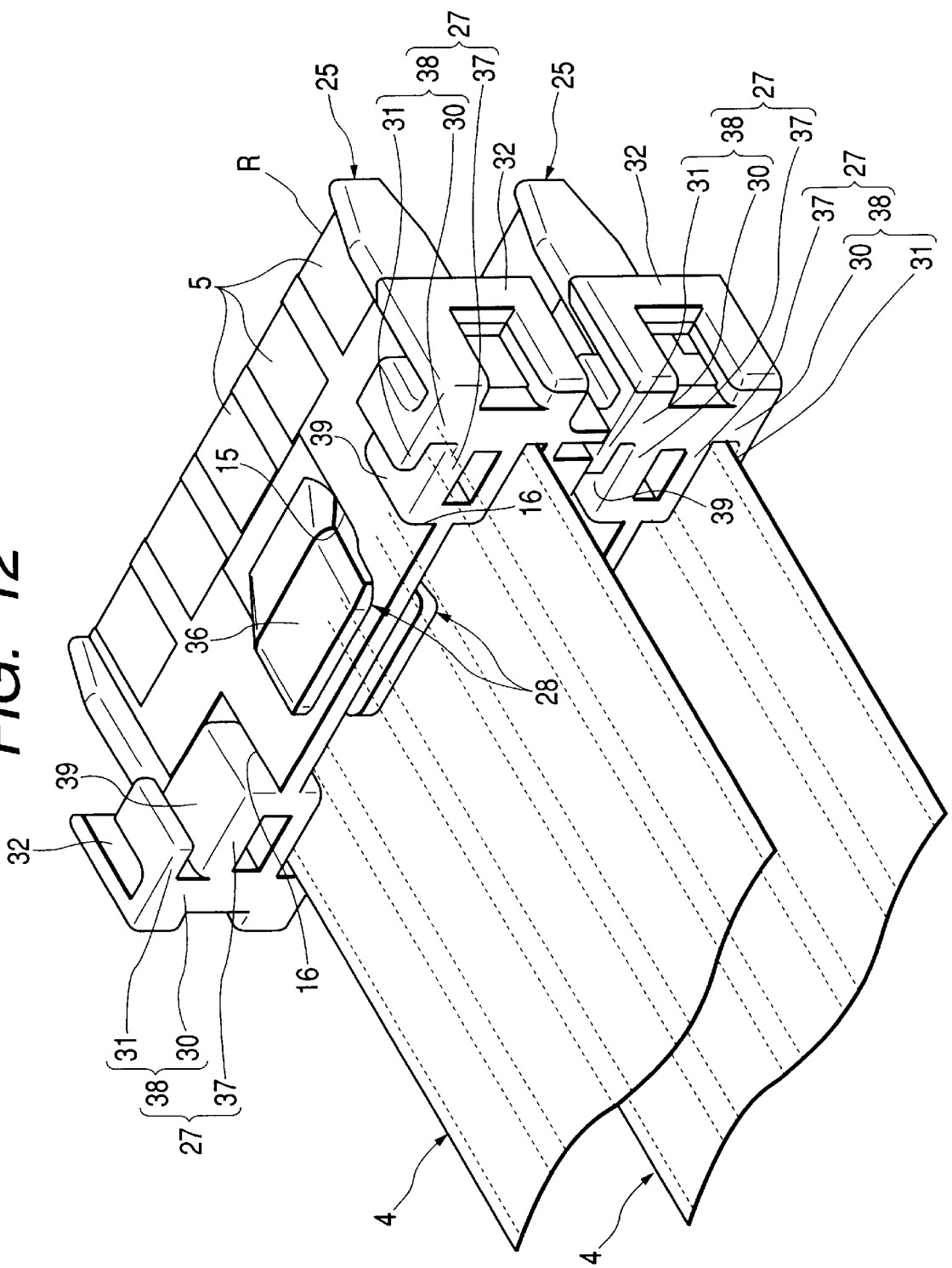
FIG. 12 is a perspective view showing a condition in which the holder of FIG. 9 is combined with the holder of FIG. 10.
Figure 13:
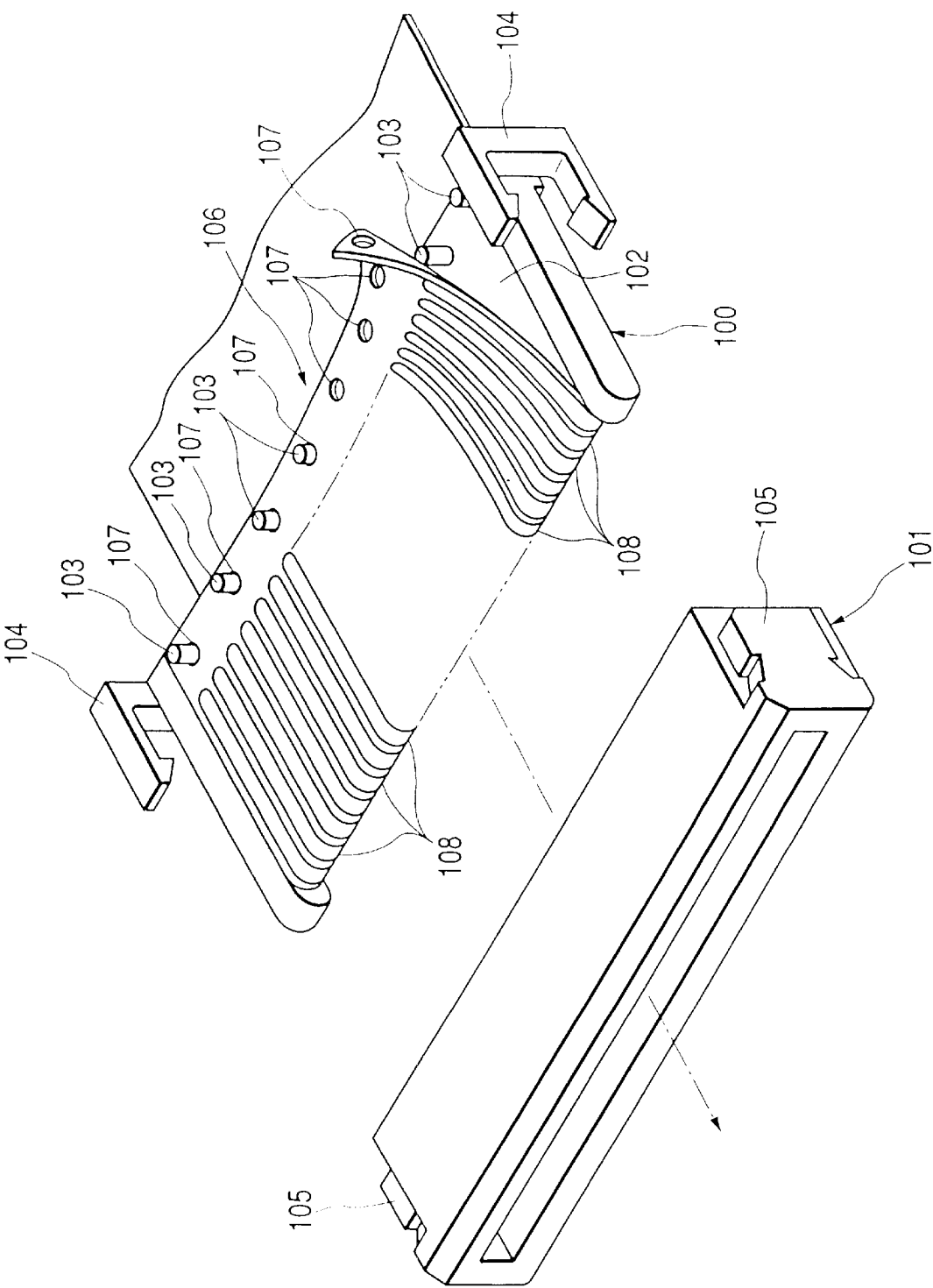
FIG. 13 is a perspective view showing a conventional holder.

As shown in FIG. 12 and other Figures, a hole 15 and a pair of notches 16 are formed in the end portion of the FPC 4. The hole 15 is formed through the FPC 4. The hole 15 is provided centrally of the width of the PFC 4. The plane shape of the hole 15 corresponds to the plane shape of each projection 20 (described later) of the holder 25. The pair of notches 16 are spaced from each other in the direction of the width of the FPC 4. The pair of notches 16 are formed respectively at corner portions of the end portion of the FPC 4 each including its end edge and longitudinal edge. The pair of notches 16 correspond in plane shape to projected portions 37 (described later) of the holder 25.

The flat circuit member, recited in this specification, is of the type which comprises a plurality of parallel (juxtaposed) conductors, and insulating sheets covering the plurality of conductors, and has a flattened shape.

Each of the pair of holders 25 holds the associated FPC 4 in such a manner that the end portion of the FPC 4 is wound around the holder 25. The two holders 25 are similar in construction to each other. The holder 25 is made of an insulative synthetic resin. As shown in FIGS. 1 and 3 to 6, the holder 25 of an integral construction includes a plate-like holder body 26, the pair of projections 28, and two pairs of gripping portions 27 (only one pair of these are shown in FIGS. 3 and 4) provided at opposite longitudinal end portions of the holder body 26.

The end portion of the FPC 4 or the like can be wound around the holder body 26 (that is, wound on the outer periphery of the holder body 26). As shown in FIGS. 3 and 4, the end portion of the FPC 4 is wound around the holder body 26 in such a manner that the direction of the width of the FPC 4 is parallel to the direction of the length of the holder body 26. One of the pair of projections 28 projects from one side (surface) 26a of the holder body 26. The other projection 28 projects from the other side (surface) 26b facing away from the one side 26a.

The two projections 28 are provided centrally of the length of the holder body 26. Namely, the projection 28 are disposed centrally of the width of the FPC 4. The projections 28 are provided at one widthwise end portion of the holder body 26. Each projection 20 includes a groove 29 for gripping the end edge portion of the FPC 4, and a tapering surface 35.

The groove 29 is formed in an end surface 28a of each projection 28 which is remote from a folded portion R (shown in FIG. 1 and others) formed at the FPC 4 when winding the FPC 4 around the holder body 26. The groove 29 is formed in the end surface 28a, and has a channel-shaped cross-section. The tapering surface 35 is formed at an end portion 28b of the projection 20 which is close to the folded portion R formed at the FPC 4 when winding the FPC 4 around the holder body 25. The end portion 28b generally faces the folded portion R, and is generally close to the folded portion R.

As the distance of the tapering surface 35 from the surface 26a, 26b increases, the tapering surface 35 is slanting gradually in a direction away from the folded portion R. The tapering surface 35 is inclined both relative to the surface 26a, 26b of the holder body 26 and relative to a plane perpendicular to the surface 26a, 26b.

The projection 28 can pass through the hole 15 formed through the end portion of the FPC 4. The projection 28 retains the FPC 4 in such a manner that that portion of the FPC 4, defining an inner edge portion of the hole 15, is held in the groove 29. An end surface 36 of each projection 28, spaced from the surface 26a, 26b of the holder body 26, is parallel to the surface 26a, 26b of the holder body 26.

The four gripping portions 27 are provided at each holder 25. The pair of gripping portions 27 are provided at each of the opposite end portions in the width direction of the holder body 26. The two gripping portions 27 are formed on the one surface 26a, and the two gripping portions 27 are formed on the other surface 26b.

The two gripping portions 27, formed on one of the surfaces 26a and 26b, are spaced from each other in the width direction of the holder body 26, that is, in the direction of the width of the FPC 4. Namely, the gripping portions 27, formed on the one of the surfaces 26a and 26b, are provided at the opposite end portions in the width direction of the holder body 26, respectively. The gripping portions 27, formed on the one of the surfaces 26a and 26b, are arranged such that the projection 28 is disposed between these gripping portions 27. The gripping portions 27, formed on the other of the surfaces 26a and 26b, are similar to the gripping portions 27 formed on the one of the surfaces 26a and 26b, and therefore description thereof will be omitted.

Figure 5:
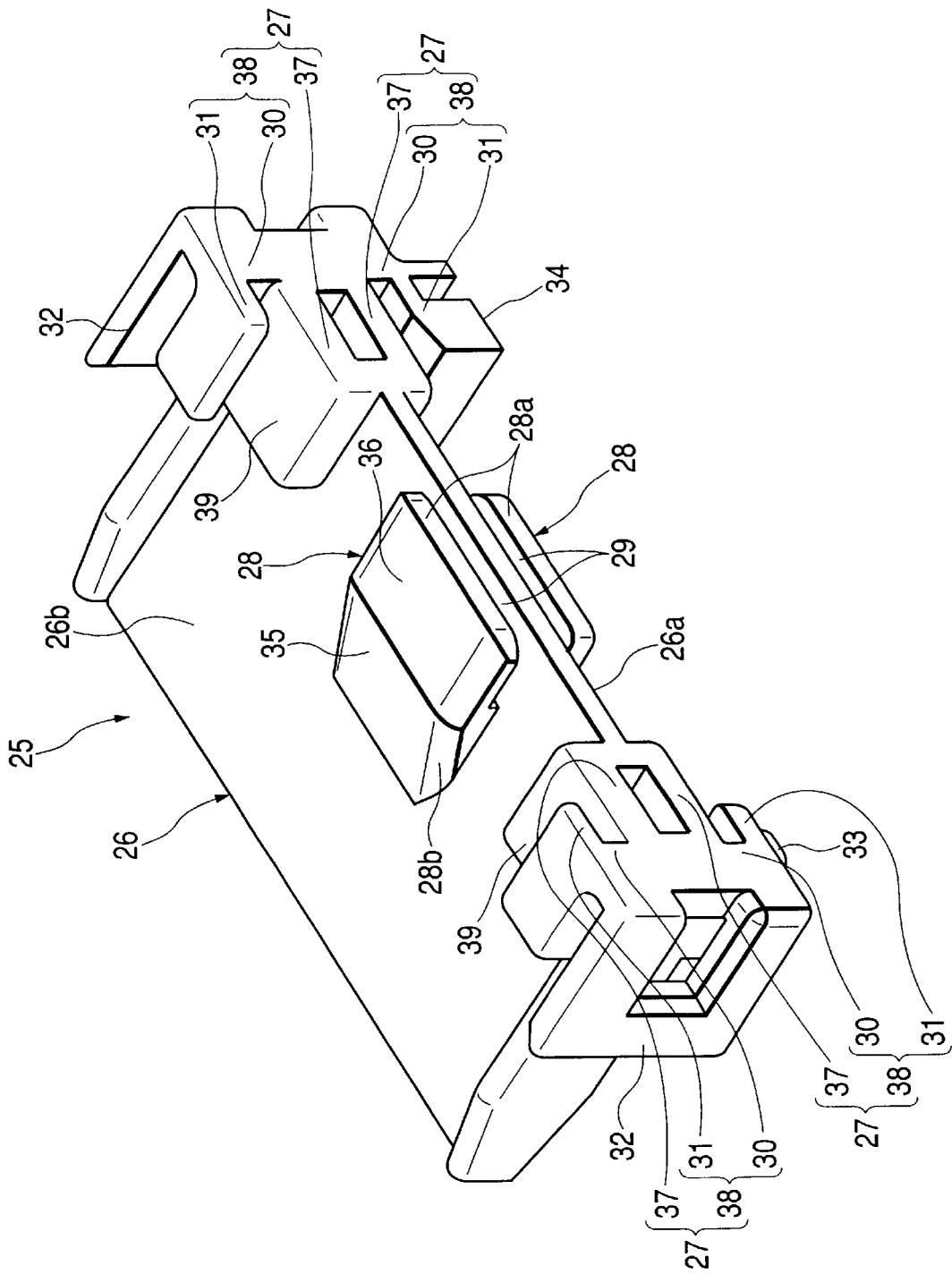
FIG. 5 is a perspective view of the preferred embodiment of the holder of the invention.
Figure 6:
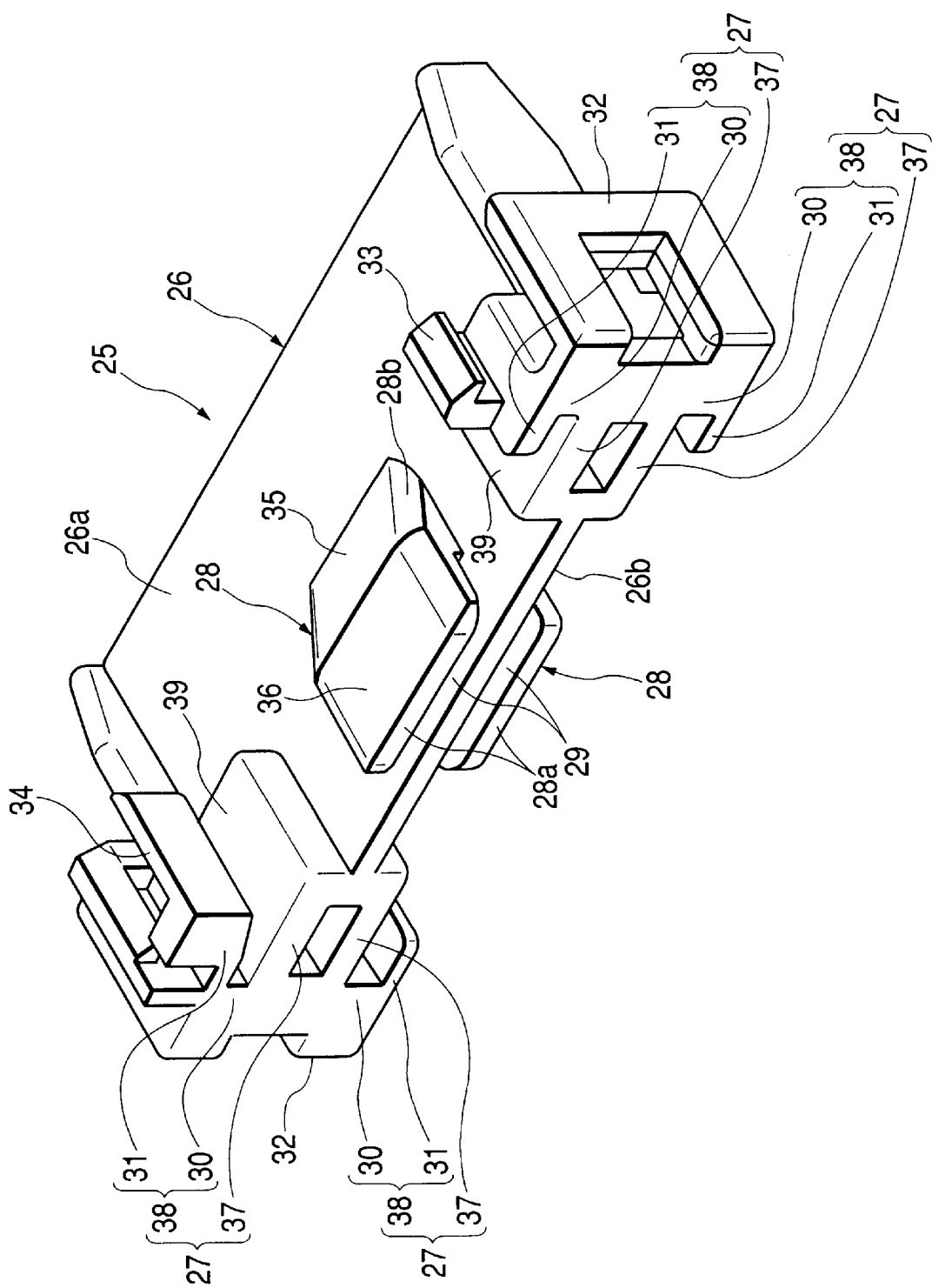
FIG. 6 is a perspective view of the holder of FIG. 5 as seen from another direction.

As shown in FIGS. 5 and 6, each gripping portion 27 includes the projected portion 37 projecting from the one surface 26a or the other surface 26b, and a gripping wall 38 extending from the projected portion 37. A second end surface 39 of the projected portion 37, spaced from the surface 26a, 26b of the holder body 26, is parallel to the surface 26a, 26b.

The gripping wall 38 includes a side wall 30 extending from the projected portion 37 in a direction perpendicular to the surface 26a, 26b of the holder body 26, and a parallel wall 31 extending from an end of the side wall 30 in a direction parallel to the second end surface 39 of the projected portion 37, that is, parallel to the surface 26a, 26b of the holder body 26. The parallel walls 31 of the two gripping portions 27, formed respectively at the opposite end portions of the holder body 26, extend respectively from the sidewalls 30 toward each other.

Thus, the gripping wall 38 first extends from the projected portion 37 in the direction away from the holder body 26, and then extends parallel to the projected portion 37 in overlying relation thereto. With this construction, the gripping portion 27 can grip the side edge portion of the FPC 4 in such a manner that the side edge portion is held between the parallel wall 31 of the gripping wall 38 and the projected portion 37.

The height H1 (shown in FIG. 8) of the end surface 36 of the projection 28 from the surface 26a, 26b is equal to (or generally equal to) the height H2 (shown in FIG. 8) of the second end surface 39 of the projected portion 37 from the surface 26a, 26b. Therefore, the end surfaces 36 and 39 are even with each other. Therefore, the end surface 36 and the second end surfaces 39 lie on a common plane (or generally common plane). In this specification, that the end surfaces 36 and 39 are even with each other means that those end surfaces 36 and 39 are disposed on a common plane (or generally common plane).

The lock piece portion 32, with which the convex portion 7a of the male housing 2 is engageable, extends from the gripping portion 27. The holder 25 includes a retaining claw 33 (serving as a retaining portion), and a retaining reception claw 34 (serving as a retaining reception portion), and these retaining portions 33 and 34 serve to fix the holder bodies 26, stacked together in parallel relation to each other, to each other. The retaining claw 33 can be retainingly engaged with the corresponding retaining reception claw 34.

Figure 7:
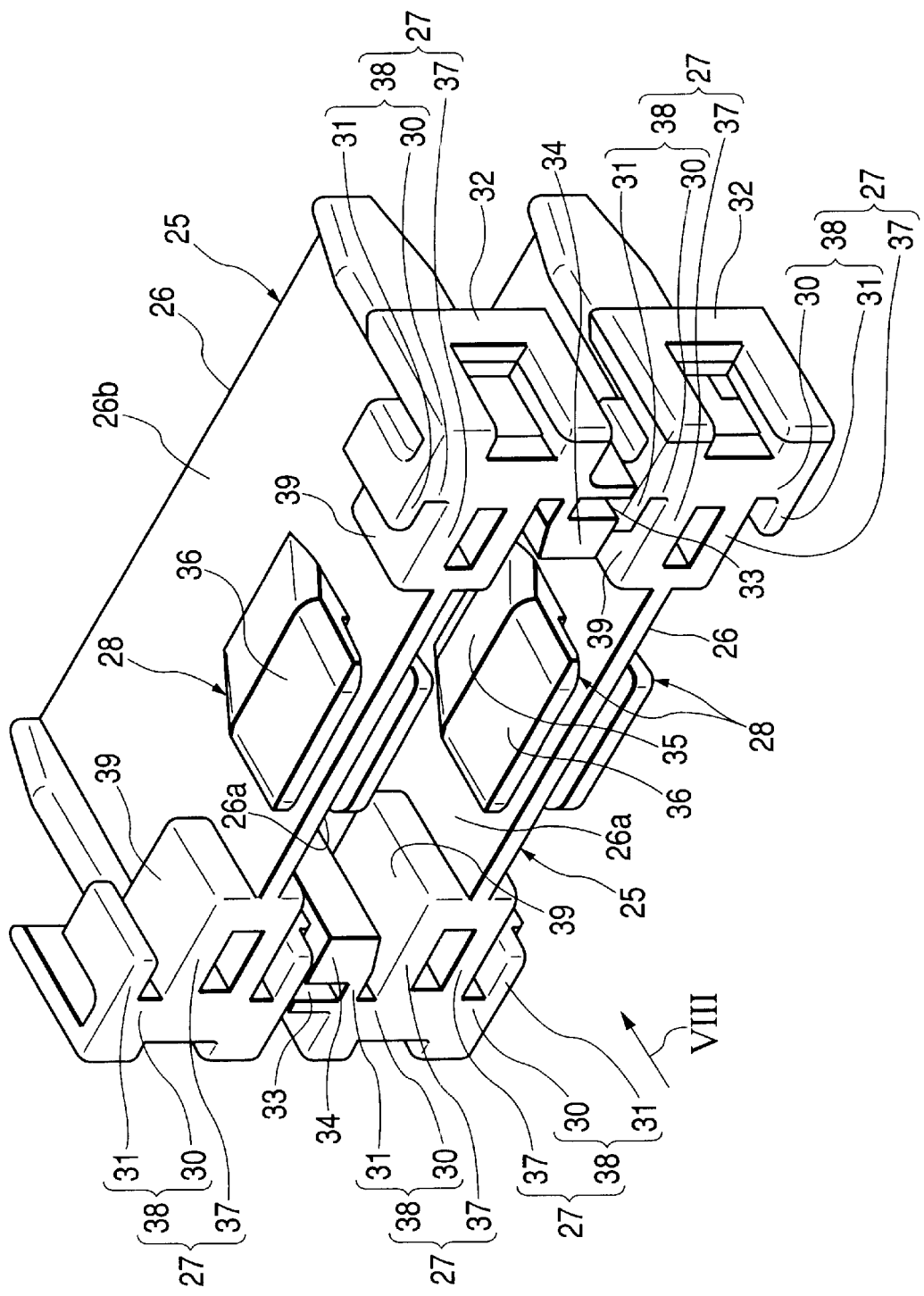
FIG. 7 is a perspective view a condition in which a pair of holders of FIG. 5 are combined together.
Figure 8:
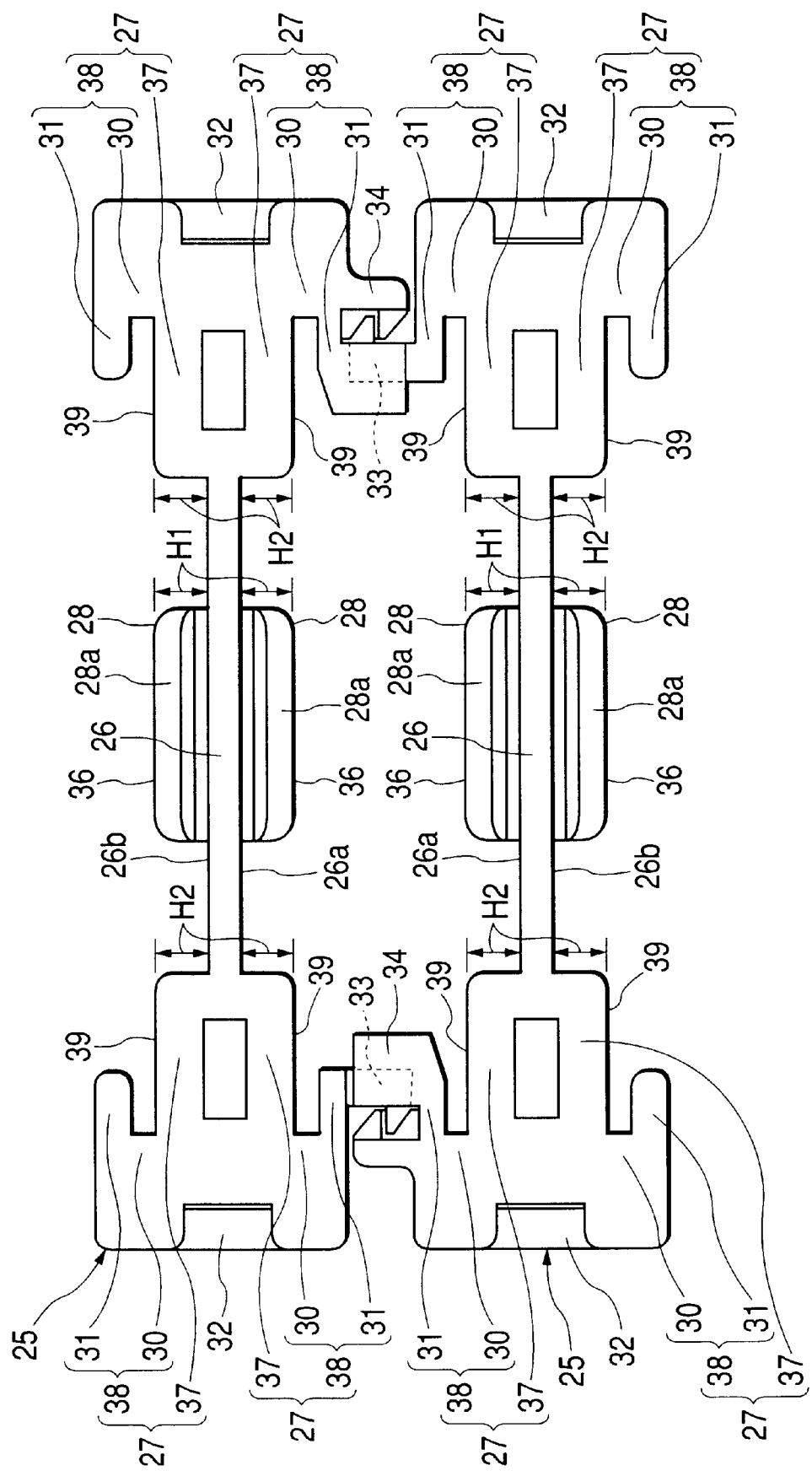
FIG. 8 is a view as seen in a direction of arrow VIII of FIG. 7.

The retaining claw 33 and the retaining reception claw 34 extend respectively from the pair of gripping portions 27 formed on one of the opposite surfaces 26a and 26b. In the illustrated example, the retaining claw 33 and the retaining reception claw 34 extend respectively from the pair of gripping portions 27 formed on the one surface 26a. Each retaining claw 33 is engaged with the corresponding retaining reception claw 34, so that the pair of holders 25 are fixed to each other, with their one surfaces 26a opposed to each other, as shown in FIGS. 7 and 8. In this manner, the holders 25 are stacked together, with their holder bodies 26 disposed parallel to each other.

In the illustrated example, the pair of holders 25 are stacked together, and are fixed to each other. In FIG. 1, only the retaining claw 33 and the retaining reception claw 34, formed on the lower holder 25, are shown. The upper holder 25, shown in FIG. 1, has the same retaining claw and the same retaining reception claw.

The end portion of the FPC 4, at which the conductors 5 are exposed to the outside, is laid on one of the surfaces 26a and 26b of the holder 25 of the above construction. Then, the projection 28 is passed through the hole 15, thereby retaining the FPC 4 by this projection 28, and at the same time the notches 16 are fitted on the projected portions 37, respectively. Then, the FPC 4 is folded to form the folded portion R, and is laid on the other of the surfaces 26a and 26b, and the opposite side edge portions of the FPC 4 are gripped respectively by the gripping portions 27 formed on the other of the surfaces 26a and 26b facing away from the one surface having the projection 28 passing through the hole 15. In this manner, the FPC 4 is wound around the holder body 26 of the holder 25, and is held by the holder 25 in this condition.

With respect to the upper holder 25 shown in FIG. 1, the FPC 4 is retained by the projection 28 projecting from the one surface 26a, and the opposite side edge portions of the FPC 4 are gripped respectively by the gripping portions 27 formed on the other surface 26b, as shown in FIG. 3. With respect to the lower holder 25 shown in FIG. 1, the FPC 4 is retained by the projection 28 projecting from the other surface 26b, and the opposite side edge portions of the FPC 4 are gripped respectively by the gripping portions 27 formed on the one surface 26a, as shown in FIG. 4.

Then, the one surfaces 26a of the two holders 25 are opposed to each other, and in this condition each retaining claw 33 is engaged with the corresponding retaining reception claw 34, thereby fixing the pair of holders 25 to each other. The pair of holders 25, thus fixed together, are inserted into the tubular portion 7, with the longitudinal axis of each holder body 26 kept parallel to the direction of the width of the male housing 2. The lock piece portions 32 are engaged with the convex portions 7a, respectively, thereby fixing the holders 25 to the male housing 2.

As a result, the exposed conductors 5, disposed at the end portion of each FPC 4, and the associated holder body 26, are gripped by the pairs of gripping piece portions 12 of the electrical contact portions of the tuning fork-shaped terminals 1. In this manner, each holder 25 electrically connect the conductors 5 of the FPC 4 to the tuning fork-shaped terminals 1, respectively. Each holder 25, having the FPC 4 wound therearound, is attached to the male housing 2.

In this embodiment, the projections 28 for fixing the FPC 4 are formed respectively on the opposite surfaces 26a and 26b of the holder body 26. Therefore, both in the case where the first insulating sheet 9a is removed (see FIGS. 3 and 4) and in the case where the second insulating sheet 9b is removed (see FIGS. 9 and 10), the FPC 4 can be held by the holder, with the conductors 5 exposed to the outside, by suitably selecting the projection 28 for passing through the hole 15.

Figure 9:
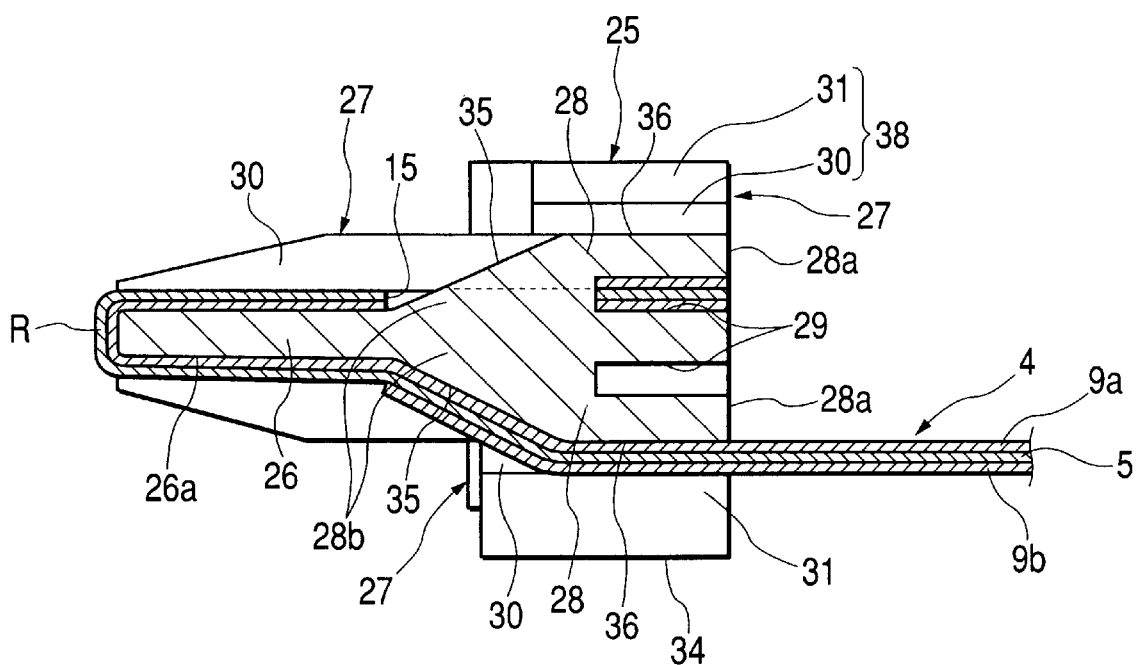
FIG. 9 is a cross-sectional view showing a condition in which an FPC, from which a second insulating sheet is removed, is wound on the upper holder in FIG. 1.

FIG. 9 shows the case where the upper holder 25 in FIG. 1 holds the FPC 4 from which the second insulating sheet 9b is removed. In FIG. 9, the FPC 4 is retained by the projection 26 projecting from the other surface 26b of the upper holder 25 in FIG. 1, and the opposite side edge portions of the FPC 4 are gripped respectively by the gripping portions 27 formed on the one surface 26a.

Figure 10:
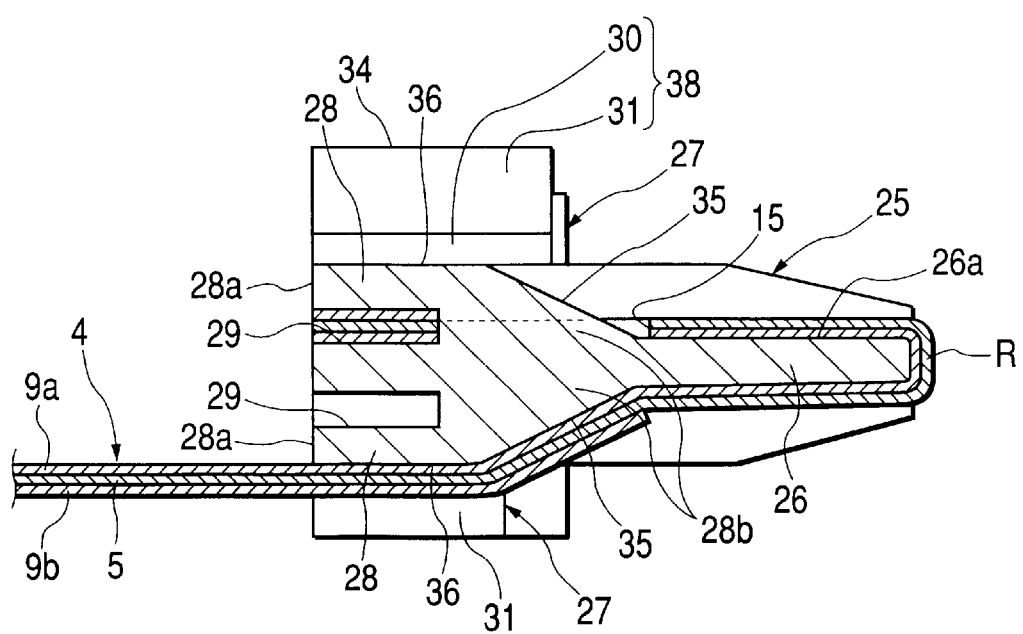
FIG. 10 is a cross-sectional view showing a condition in which an FPC, from which a second insulating sheet is removed, is wound on the lower holder in FIG. 1.

FIG. 10 shows the case where the lower holder 25 in FIG. 1 holds the FPC 4 from which the second insulating sheet 9b is removed. In FIG. 10, the FPC 4 is retained by the projection 28 projecting from the one surface 26a of the lower holder 25 in FIG. 1, and the opposite side edge portions of the FPC 4 are gripped respectively by the gripping portions 27 formed on the other surface 26b.

Figure 11:
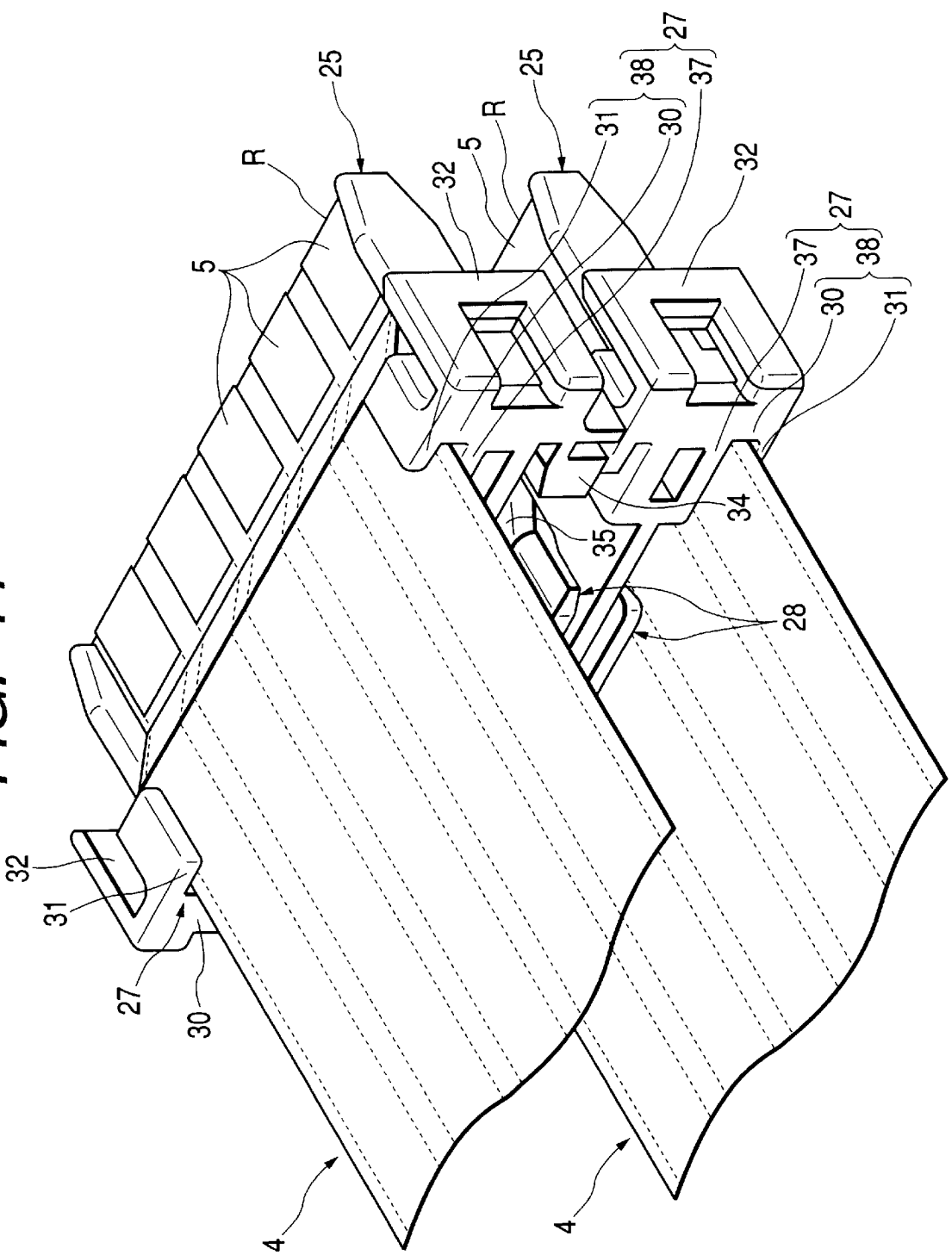
FIG. 11 is a perspective view showing a condition in which the holder of FIG. 3 is combined with the holder of FIG. 10.

The holder 25 can positively hold the FPC 4, from which either of the first and second insulating sheets 9a and 9b is removed, in such a manner that the conductors 5 are exposed to the outside, as shown in FIGS. 11 and 12. Therefore, the holder 25 can positively electrically connect the FPC 4, from which either of the first and second insulating sheets 9a and 9b, is removed, to the tuning fork-shaped terminals 1 in the male housing 2.

The tapering surface 35 is formed at the end portion 20b of the projection 28 which is close to the folded portion R of the FPC 4. As the distance of the tapering surface 35 from the surface 26a, 26b of the holder body 26 increases, the tapering surface 35 is slanting gradually in the direction away from the folded portion R. Therefore, when the FPC 4 is laid on the projection 28, a fold or the like is prevented from being accidentally formed at the FPC 4. Therefore, the conductors 5 of the FPC 4 are prevented from being cut.

The holder 25 has the gripping portions 27 for gripping the opposite side edge portions of the FPC 4. Therefore, the FPC 4, wound and held on the holder body 26, is prevented from being accidentally disengaged from the holder body 26. Therefore, the holder 25 can positively hold the FPC 4, with the conductors 5 exposed, and can positively electrically connect the conductors 5 to the respective tuning fork-shaped terminals 1 or the like.

The height H1 of the end surface 36 from the surface 26a, 26b is equal to (or generally equal to) the height H2 of the second end surface 39 from the surface 26a, 26. The end surfaces 36 and 39 are even with each other. Therefore, the FPC 4, gripped by the gripping portions 27, is prevented from being curved in the direction of the width thereof. Therefore, a fold is prevented from being accidentally formed at the FPC 4, thereby preventing the conductors 5 from being cut. And besides, the opposite side edge portions of the FPC 4 can be positively gripped by the gripping portions 27, respectively, thereby preventing the FPC 4 from being accidentally disengaged from the holder 25. Therefore, the holder 25 can more positively hold the FPC 4, with the conductors 5 exposed, and can more positively electrically connect the conductors 5 to the respective tuning fork-shaped terminals 1 or the like.

The pair of holders 25 are combined together, and thereafter these holders are attached to the male housing 2. Therefore, the time and labor, required for assembling the connector 40 of the above construction, can be reduced as compared with the case where the holders 25 is attached one by one to the male housing 2. Therefore, the time and labor, required for assembling the connector 40 and for assembling a wire harness having the connector 40, can be reduced.

In the above embodiment, the FPC 4 is used as the flat circuit member. However, in the present invention, a flexible flat cable (FFC) can be used as the flat circuit member.

In the above embodiment, the retaining claw 33 and the retaining reception claw 34 are provided at the holder 25, and the pair of holder 25 are combined together. However, in the present invention, there may be used an arrangement in which the retaining claw 33 is formed on the one surface 26a of the holder 25 while the retaining reception claw 34 is formed on the other surface 26b so that three or more holders 25, stacked one upon another, can be fixed to one another.

In the holder of the invention, the flat circuit member can be positively held by the holder in such a manner that the hole is retainingly fitted on either of the projections projecting from the one surface and the other surface of the holder body. Therefore, the flat circuit member, from which either of the first and second insulating sheets is removed, can be positively held by the holder, with the conductors exposed to the outside. Therefore, the conductors of the flat circuit member, from which either of the insulating sheets is removed, can be positively electrically connected to other conductors such as metal terminals.

In the holder of the invention, there are provided the gripping portions for respectively gripping the opposite side edge portions of the flat circuit member. Therefore, the conductors of the flat circuit member, from which either of the insulating sheets is removed, can be positively electrically connected to other conductors such as metal terminals, and in addition the flat circuit member, attached to the holder body is prevented from being disengaged from the holder body.

In the holder of the invention, as the distance of the tapering surface from the holder body increases, the tapering surface is slanting gradually in the direction away from the folded portion. Therefore, a fold or the like is prevented from being accidentally formed at the flat circuit member, attached to the holder, by contact of the projection with the flat circuit member. Therefore, the conductors of the flat circuit member, from which either of the insulating sheets is removed, can be positively electrically connected to other conductors such as metal terminals, and in addition the conductors are positively prevented from being cut.

In the holder of the invention, the end surface of the projection and the second end surfaces of the projected portions are even with each other. Therefore, the flat circuit member is prevented from being curved in the direction of the width thereof. Therefore, a fold or the like is prevented from being accidentally formed at the flat circuit member. Therefore, the conductors of the flat circuit member, from which either of the Insulating sheets is removed, can be positively electrically connected to other conductors such as metal terminals, and in addition the conductors are positively prevented from being cut.

And besides, the flat circuit member is prevented from being curved in the direction of the width thereof, and therefore the opposite side edge portions of the flat circuit member are prevented from being disengaged respectively from the gripping portions. Therefore, the flat circuit member is prevented from being disengaged from the holder body. Therefore, the flat circuit member can be positively held by the holder, and can be positively electrically connected to other conductors such as metal terminals.

In the holder of the invention, the flat circuit members are attached to the plurality of holders, respectively, and thereafter the plurality of holders are combined together, and then can be mounted at a time in the connector housing or the like. Then, a wire harness or the like can be assembled. Therefore, the flat circuit member can be positively held; and can be positively electrically connected to other conductors such as metal terminals, and in addition the time and labor, required for assembling the wire harness, can be reduced.

What is claimed is:

1. A holder comprising:
a flat circuit member including a plurality of conductors and a pair of insulating sheets covering the plurality of conductors, wherein one of the pair of insulating sheets is removed from an end portion of the flat circuit member so that the plurality of conductors is exposed at the end portion;
a hole formed through the end portion;
a holder body, around which the flat circuit member can be wound, defining first and second surfaces; and
a pair of projections projecting from the first and second surfaces of the holder body, respectively,
wherein the end portion of the flat circuit member is wound around the holder body, and one of the pair of projections is retained in the hole so as to hold the flat circuit member, and
wherein a pair of gripping portions for respectively gripping opposite side end portions of the flat circuit member are formed on each of the first and second surfaces of the holder body, respectively.

2. The holder according to claim 1, wherein
the holder body has a plate-like shape, and has opposite surfaces defining the first and second surfaces, respectively, and
the end portion of the flat circuit member is laid on the first surface, and the projection projecting from the first surface is retained in the hole, and the end portion is folded to be laid on the second surface so that the end portion is wound around the holder body.

3. The holder according to claim 1, wherein the gripping portion includes a projected portion projecting from each of the first and second surfaces, and a gripping wall which extends from the projected portion in a direction away from the holder body and extends parallel to the projected portion in overlying relation to the projected portion, so that the side end portions of the flat circuit member can be held between the projected portion and the gripping wall.

4. The holder according to claim 3, wherein an end surface of the projection spaced from the holder body and a surface of the projected portions spaced from the holder body are in a same plane.

5. The holder according to claim 1, wherein each of the plurality of conductors has a rectangular transverse cross-section and has a strip-like shape.

6. The holder according to claim 1, wherein the pair of insulating sheets are made of insulative synthetic resin.

7. The holder according to claim 1, wherein the hole is provided in a central position in a width direction of the end portion.

8. The holder according to claim 1, wherein the holder body is made of an insulative synthetic resin.

9. The holder according to claim 1, wherein each of the pair of projection includes a groove.

10. The holder according to claim 1, wherein the holder body includes a retaining portion and a retaining reception portion which is engageable with the corresponding retaining portion, and a plurality of the holder bodies are stacked together in such a manner that the retaining portion and the retaining reception portion of each of the plurality of the holder bodies are engaged with the retaining reception portion and the retaining portion of the adjacent holder body, respectively.

11. The holder according to claim 2, wherein a tapering surface is formed at an end portion of the projection close to a folded portion of the flat circuit member wound around the holder body.

12. A holder comprising:
a flat circuit member including a plurality of conductors and a pair of insulating sheets covering the plurality of conductors, wherein one of the pair of insulating sheets is removed from an end portion of the flat circuit member so that the plurality of conductors is exposed at the end portion;
a hole formed through the end portion;
a holder body, around which the flat circuit member can be wound, defining first and second surfaces; and
a pair of projections projecting from the first and second surfaces of the holder body, respectively,
wherein the end portion of the flat circuit member is wound around the holder body, and one of the pair of projections is retained in the hole so as to hold the flat circuit member,
wherein the holder body has a plate-like shape, and has opposite surfaces defining the first and second surfaces, respectively, and the end portion of the flat circuit member is laid on the first surface, and the projection projecting from the first surface is retained in the hole, and the end portion is folded to be laid on the second surface so that the end portion is wound around the holder body, and wherein a tapering surface is formed at an end portion of the projection close to a folded portion of the flat circuit member wound around the holder body.

13. The holder according to claim 12, wherein the tapering surface is inclined in a direction perpendicular to the first and second surfaces, and is slanting in a direction away from the folded portion as the distance of the tapering surface from the holder body increases.

14. A holder comprising:

a flat circuit member including a plurality of conductors and a pair of insulating sheets covering the plurality of conductors, wherein one of the pair of insulating sheets is removed from an end portion of the flat circuit member so that the plurality of conductors is exposed at the end portion;

a hole formed through the end portion;

a holder body, around which the flat circuit member can be wound, defining first and second surfaces; and a pair of projections projecting from the first and second surfaces of the holder body, respectively, wherein the end portion of the flat circuit member is wound around the holder body, and one of the pair of projections is retained in the hole so as to hold the flat circuit member, and wherein the holder body includes a retaining portion and a retaining reception portion which is engageable with the corresponding retaining portion, and a plurality of the holder bodies are stacked together in such a manner that the retaining portion and the retaining reception portion of each of the plurality of the holder bodies are engaged with the retaining reception portion and the retaining portion of the adjacent holder body, respectively.

* * * * *